United States Patent [19]

Yeager et al.

[11] 4,189,200

[45] Feb. 19, 1980

[54] SEQUENTIALLY ACTUATED ZERO INSERTION FORCE PRINTED CIRCUIT BOARD CONNECTOR

[75] Inventors: Marvin L. Yeager, Carlisle; Jerome A. Desso, Oberlin-Steelton, both of Pa.

[73] Assignee: AMP Incorporated, Harrisburg, Pa.

[21] Appl. No.: 955,058

[22] Filed: Oct. 26, 1978

Related U.S. Application Data

[63] Continuation of Ser. No. 851,021, Nov. 14, 1977, abandoned.

[51] Int. Cl.$^2$ ........................ H01R 13/59; H05K 1/12

[52] U.S. Cl. ............................ 339/75 MP; 339/17 L; 339/176 MP

[58] Field of Search ................. 339/74, 75 M, 75 MP, 339/17 L, 17 LC, 17 LR, 176 MP; 361/399, 413, 415

[56] References Cited

U.S. PATENT DOCUMENTS

| | | | |
|---|---|---|---|
| 2,770,788 | 11/1956 | Eschner | 339/198 |
| 3,541,490 | 11/1970 | Berg | 339/176 M X |
| 3,576,515 | 4/1971 | Frantz | 339/176 MP |
| 3,648,221 | 3/1972 | Tillmann et al. | 339/74 R |
| 3,744,005 | 7/1973 | Sitzler | 339/75 MP |
| 3,793,609 | 2/1974 | McIver | 339/176 MP X |
| 3,899,234 | 8/1975 | Yeager et al. | 339/74 R |
| 3,982,807 | 9/1976 | Anhalt et al. | 339/176 MP X |
| 4,047,782 | 9/1977 | Yeager | 339/75 MP |
| 4,076,362 | 2/1978 | Ichimura | 339/75 MP |

*Primary Examiner*—Eugene F. Desmond
*Attorney, Agent, or Firm*—Russell J. Egan

[57] ABSTRACT

A sequentially actuated zero insertion force edge board connector is disclosed for receiving printed circuit boards and the like, the contacts of the connector being sequentially cam actuated for engagement with and disengagement from an edge of the printed circuit board. The subject connector has a housing with an elongated board receiving aperture, an elongated contact drive member lying freely at the bottom of the aperture and a cam member movable between the drive member and the aperature bottom. A plurality of contacts are mounted in spaced apart relationship along at least one elongated wall of the aperture. The contacts have a normal position in which they engage the pads of a printed circuit board and are sequentially moved, in at least two groups, by the drive means to an out of engagement position allowing unhampered insertion and withdrawal of a printed circuit board with respect to the connector.

22 Claims, 6 Drawing Figures

SEQUENTIALLY ACTUATED ZERO INSERTION FORCE PRINTED CIRCUIT BOARD CONNECTOR

This is a continuation of application Ser. No. 851,021, filed Nov. 14, 1977, now abandoned.

BACKGROUND OF THE INVENTION

1. The Field of the Invention

The present invention relates to a zero insertion force connector for printed circuit boards or the like and in particular to a zero insertion force edge board connector utilizing a cam member and a contact drive member for sequentially bringing a plurality of contacts into and out of engagement with respective pads on a circuit board.

2. The Prior Art

The present invention relates to an improvement over the zero insertion force edge board connectors described in my U.S. Pat. Nos. 3,899,234 and 4,047,782. In order to differentiate between zero insertion force and low insertion force connectors, the term zero insertion force means there is no engagement of the connector contacts and the pads of the circuit board during insertion and extraction of the board. However, with low insertion force connectors, there may be some engagement between the connector terminals and the board pads, but it is not of sufficient magnitude to hinder the insertion and extraction movements. Zero insertion force connectors are preferable for those instances when it is desired to keep wear of the contacts and circuit board pads to a minimum.

There are many instances in the electronic industry when it is desirable and/or necessary to have sequencing of power, ground, and signals as they are applied to and removed from a circuit. There are both mechanical and electrical reasons for having such sequencing. It is always a fear of system designers that an electronic system could be subject to substantial damage through the inadvertent and unintentional removal of a component, such as a printed circuit board or lock card, from an energized system. This leads the circuit designer generally along one of three paths in being overly cautious in preventing such damage. First, the choice of logic may be limited because some types of MOS and other logics that are bi-polar in nature, with positive and negative power supplies referenced to ground, there is the possibility that if the ground is broken first, the supply voltages will "add" across an individual gate element, overheat it, and possibly destroy it. Secondly, he may be led to a jury rig system to prevent failure in this mode. This might include spring contacts in constant engagement with a metallic board or card guide which is connected to ground of the power supply so that it is absolutely the last thing to break before a board or card is fully disengaged from the system. However, metal card guides are quite expensive to design into a system. The third alternative would be to spend large amounts of money on precautions taken with the power supplies. This could include "crow bar" current sensing and "failure protect" schemes whereby the power supply is clamped to a zero output when the load is exceeded. The "crow bar" current sensing is a form of current limiting while the "fail-protect" is used for anti-overshoot and undershoot purposes during power up and power down conditions.

Digital systems are subject to fast moving transients. The data itself is indicated by change and thus is a transient. Removal of a board or a card from such a system, while under power, can generate a tremendous number of transient fake pulses which will simulate data on a bus and thereby cause other logic elements to produce errors. This could not happen if the power were removed to deactivate the card prior to removal of the card from the system. Furthermore, on each card there is often a series of capacitors called "decoupling units". These capacitors reduce minor fluctuations that occur on the card when possibility of all of the logic gates go from a 0 to a 1 state at the same time. This rapid change in load requirements could possibly lower the board voltage to below the logic margins and again cause errors. When a logic card is removed without sequentialling, it does just that. Power supplies that respond to these characteristics are quite expensive and highly sophisticated.

SUMMARY OF THE INVENTION

The present sequentially actuated low insertion force edge board connector is intended to overcome the above-discussed difficulties and includes an elongated housing having an elongated board receiving aperture therein, a cam member positioned within the aperture and adopted to move with respect to the bottom of the aperture, a contact drive member movable with respect to the bottom of the aperture in response to movement of the cam member, and a plurality of contacts mounted in the housing along at least one elongated side of the aperture and responsive to movement of the contact drive member. The contact drive member has at least one profiled contact engaging portion to sequentially engage the contacts along the length of the connector and drive them to a disengaged position as the cam is actuated. The contacts are normally in a circuit board engaging position and are driven to an out of contact position by the cam actuated drive member.

It is therefore an object of the present invention to produce an improved, sequentially actuated, zero insertion force edge board connector in which a plurality of contacts are positioned spaced apart along at least one elongated side of the connector and are sequentially actuated for movement into and out of engagement with a printed circuit board received therein.

It is another object of the present invention to produce a sequentially actuated zero insertion force edge board connector having a plurality of contacts positioned on at least one side of an elongated aperture in the connector with the contacts being sequentially movable between a remote position and a normal board engaging position by a contact drive member responsive to movement of a cam member and which drive member sequentially acts upon the contacts to produce the relative movement thereof.

It is a still further object of the present invention to produce a sequentially actuated zero insertion force edge board connector in which a contact drive member has a stepped profile acting on the contacts to produce the desired sequential movement into and out of engagement with a printed circuit board received in the connector.

It is yet another object of the present invention to produce a sequentially actuated improved zero insertion force edge board connector which can be readily and economically produced.

The foregoing and other objects of the present invention will become apparent to those skilled in the art from the following detailed description taken with reference to the accompanying drawings.

DETAILED DESCRIPTION OF THE PREFERRED EMBODIMENT

Figure 1:
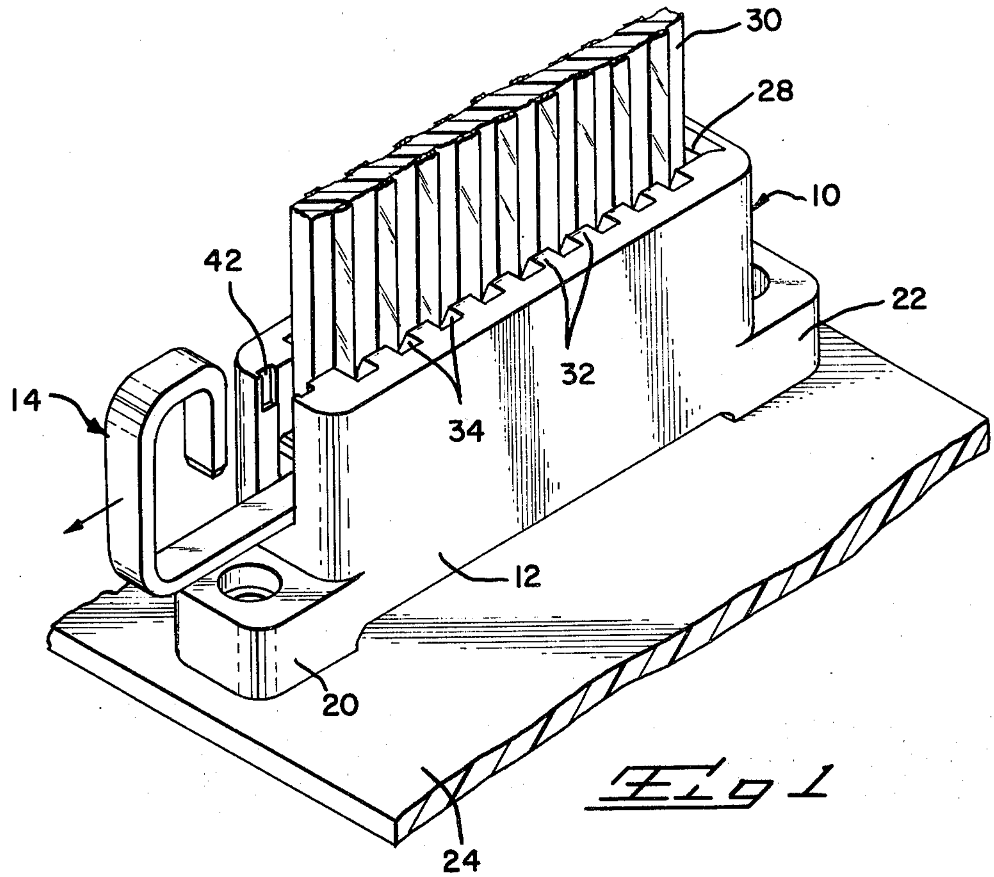
FIG. 1 is a perspective view of the subject sequentially actuated zero insertion force edge board connector.

The preferred embodiment of the subject sequentially actuated zero insertion force edge board connector 10 includes four primary components, namely, a housing 12, a cam member 14, a contact driving member 16, and a plurality of contacts 18.

The housing 12 has an elongated profile with mounting flanges 20, 22 at the opposite ends thereof to secure the connector to a board or chassis 24 by attachment means 26. The housing 12 also includes an elongated central aperture 28 in which a daughter circuit board 30 is received. At least one elongated sidewall of the aperture is provided with a plurality of spaced apart contact spacer projections 32 which define therebetween a plurality of contact recesses 34 in which a respective contact 18 is received. A passage 36 extends from the end of each recess 34 through the base 38 of the housing 12. A longitudinally extending cam receiving groove 40 extends centrally of the base of the aperture 28 and through at least one end wall of the housing. At least one cam locking recess 42 is also provided in the housing.

Figure 2:
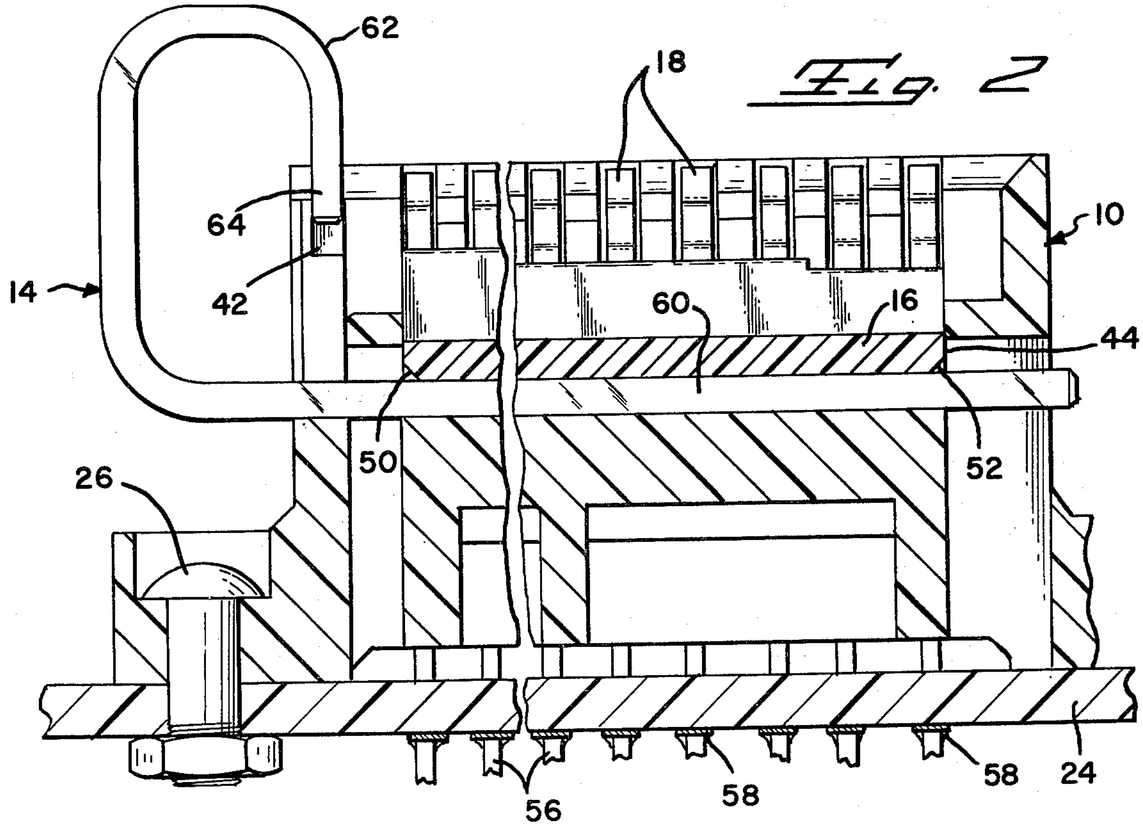
FIG. 2 is a longitudinal vertical section through the subject connector of FIG. 1.
Figure 6:
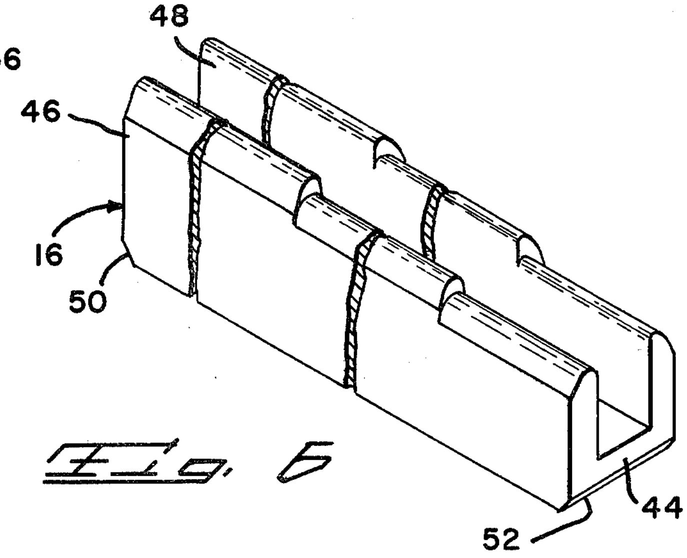
FIG. 6 is a foreshortened perspective view of the contact drive member of the subject invention.

The contact driving member 16 has a generally channel shaped section with a base portion 44 and two parallel sidewalls 46, 48. The base portion 44 lies in the groove 28 where it can be engaged by the cam 14. The upper free edges of the sidewalls 46 and 48 are profiled, as best seen in FIGS. 2 and 6, with a series of steps which sequentially engage and drive the respective contacts 16 of the connector 10. Other profiled configurations could also be used according to the desired order of sequencing of the contacts. The longitudinal ends of the base 44 may include beveled surfaces 50, 52 which aid in insertion of the driving member 16 into aperture 28 during the initial assembly of the connector 10.

The contacts 16 may be formed by any of the well known methods including conventional strip stamping, wire forming and roll forming. Each contact has a resilient board engaging portion 54 and a terminal portion 56 which extends through the passage 36 and can be electrically and mechanically jointed to circuitry 58 on board 24 or to further conductors (not shown) by known means such as wire wrap connectors (also not shown). The driving member acts against the resilient board engaging portion of the respective contacts. Each contact is fixedly mounted in the housing by locking lance means (not shown) or an aperture could be formed in the contact and the material of the housing flowed therein by punching (also not shown).

The cam 14 has an elongated portion 60 of rectilinear section and a handle portion 62 enabling rotation of the cam about the longitudinal axis of portion 60. The free end 64 of the handle portion 62 is receivable in locking recesses 42 of the housing to both prevent unintended rotation of the cam and loss or removal of the cam from the connector 10.

The subject connector can be assembled by insertion of the cam 14 and driving member 16 into the housing 12. The contacts 18 are then loaded into the housing and hold the driving member 16 therein by the normal deflection of portions 54.

Figure 3:
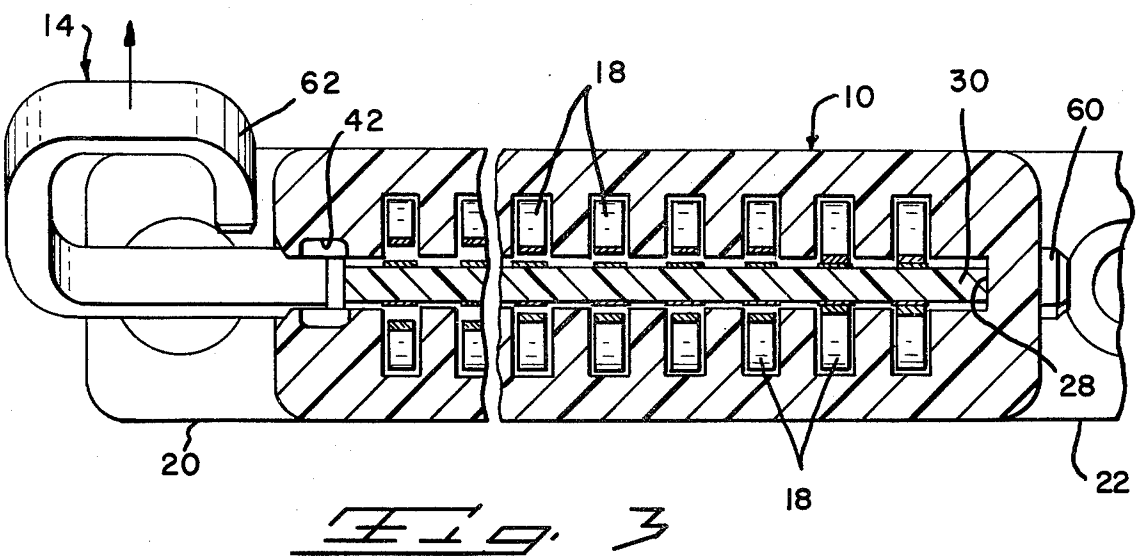
FIG. 3 is a horizontal longitudinal section taken through the subject connector of FIG. 1.
Figure 4:
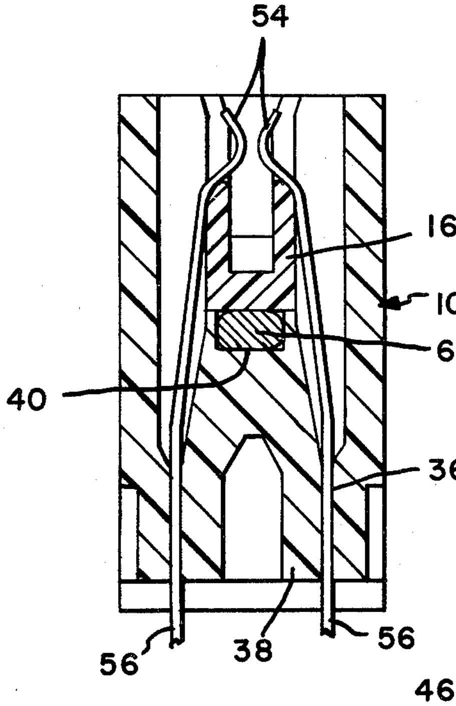
FIG. 4 is a vertical transverse section through the subject connector with the contacts in their normal condition.
Figure 5:
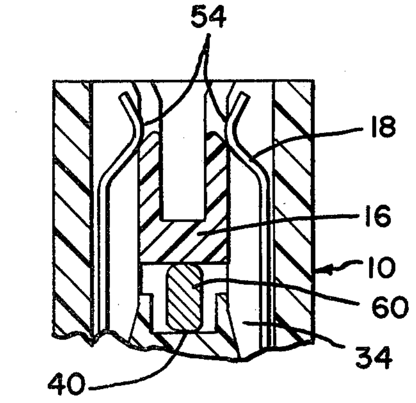
FIG. 5 is a partial vertical transverse section, similar to FIG. 4, showing the connector in an actuated condition.

The subject connector is operated by a rotational movement of the cam 14 about the axis of elongated portion 60 to vertically displace the contact driving member 16, as shown in FIGS. 4 and 5. The profiled step configuration of the sidewalls 46, 48 of the contact driving member 16 causes a sequential actuation of the contacts 18 as shown in FIG. 3 wherein the contacts are shown fully disengaged, partially disengaged and fully contacting the daughter board 30, reading from left to right. These groups of contacts could correspond to signal, power and ground carrying contacts, respectively.

The subject connector has been shown with two parallel spaced rows of contacts. However, it is well within the scope of the present invention to have a single row of contacts along only one side of a connector housing which is to receive a single sided printed circuit board. It is also possible to have the contacts in any other desired configuration of continuous or discontinuous rows on either or both sides of the housing. Of course, the contacts can be provided with any of the generally accepted coatings or platings, as desired, without departing from the present invention.

The present invention may be subject to many other modifications and changes without departing from the spirit or essential characteristics thereof. The present embodiments are therefore to be intended in all respects as being illustrative and not restrictive of the scope of the invention.

What is claimed is:

1. A sequentially actuated, zero insertion force, edge board connector comprising:
   - a housing having an elongated circuit board receiving aperture, a plurality of contact recesses in parallel spaced apart relationship extending along at least one elongated side of said aperture, a like plurality of contact passageways aligned with respective recesses and extending through a base portion of said housing, and a cam receiving groove extending longitudinally of and centrally in the bottom of said aperture and opening therein;
   - cam means mounted for rotational movement in said groove;
   - a contact driving member movably mounted in said elongated aperture of said housing and adopted to be driven by said cam means in a direction normal to said cam receiving groove, said contact driving member having a longitudinally stepped profile; and
   - a plurality of contacts each having a resilient board engaging portion and an integral terminal portion, said contacts being fixedly mounted in parallel spaced relation along at least one elongated side of said housing aperture with said terminal portions thereof extending through said passageways and with said board engaging portions positioned to be engaged by said contact driving means whereby said contacts are sequentially engaged by said driving means and driven between a first normal position, in which they engage a circuit board positioned in said circuit board receiving aperture, and a second position disengaged from said circuit board.

2. A sequentially actuated, zero insertion force, edge board connector according to claim 1 further comprising:

means to mount said housing on a surface including at least one aperture flange integral with said hosing and removable securing means passing through said aperture and engaging said surface.

3. A sequentially actuated, zero insertion force, edge board connector according to claim 1 further comprising:

at least one cam locking recess in said housing into which a portion of said cam means is inserted to prevent unintended rotation or removal of said cam means from said housing.

4. A sequentially actuated, zero insertion force edge board connector according to claim 3 wherein said cam means comprises:

an elongated portion of substantially rectangular section extending along said cam receiving groove, and a handle portion extending substantially normal to said elongated portion, a free end of said handle portion being receivable in said cam locking recess.

5. A sequentially actuated, zero insertion force, edge board connector according to claim 4 wherein:

said cam engages said cam locking recess in a position with the contacts in their normal condition and said contact drive member in a retracted condition.

6. A sequentially actuated, zero insertion force, edge board connector according to claim 1 wherein said contact recesses, said contact passageways, and said contacts are arranged in rows along either side of said elongated aperture.

7. A sequentially actuated, zero insertion force, edge board connector according to claim 1 wherein:

said contact driving member has a channel shaped section including a base and a pair of integral upstanding sidewalls, the upper free edge of at least one sidewall having a profiled configuration adapted to sequentially engage said contacts as said contact driving member is driven by said cam.

8. A sequentially actuated, zero insertion force, edge board connector according to claim 7 wherein:

said profiled configuration of said sidewall comprises at least two steps.

9. A sequentially actuated, zero insertion force, edge board connector according to claim 7 wherein:

both sidewalls of said contact driving member are profiled.

10. A sequentially actuated, zero insertion force, edge board connector comprising:

a housing having an elongated longitudinally extending circuit board receiving aperture, a plurality of contact passageways extending through a base portion of said housing, and a cam receiving groove extending longitudinally of and centrally in the bottom of said aperture and opening therein;

cam means mounted for movement in said groove;

a contact driving member movably mounted in said elongated aperture of said housing and adopted to be driven by said cam means in a direction normal to said cam receiving groove, said contact driving member having a longitudinally stepped profile; and a plurality of contacts each having a resilient board engaging portion and an integral terminal portion, said contacts being fixedly mounted in parallel spaced relation along at least one elongated side of said housing aperture with said terminal portions thereof extending through said passageways and with said board engaging portions positioned to be engaged by said contact driving means whereby said contacts are sequentially engaged by said driving means and driven between a first normal position, in which they engage a circuit board positioned in said circuit board receiving aperture, and a second disengaged position remote from said circuit board.

11. A sequentially actuated, zero insertion force, edge board connector according to claim 10 further comprising:

means to mount said housing on a surface and;

a plurality of contact recesses in parallel spaced apart relationship extending along at least one elongated side of said aperture.

12. A sequentially actuated, zero insertion force, edge board connector according to claim 10 further comprising:

at least one cam locking recess in said housing into which a portion of said cam means is inserted to prevent unintended actuation of or removal of said cam means from said housing.

13. A sequentially actuated, zero insertion force edge board connector according to claim 12 wherein said cam means comprises:

an elongated portion of substantially cross rectangular section extending along said cam receiving groove, and a handle portion extending substantially normal to said elongated portion, a free end of said handle portion being receivable in said cam locking recess.

14. A sequentially actuated, zero insertion force, edge board connector according to claim 13 wherein:

said cam engages said cam locking recess in a position with the contacts in their normal condition and said contact drive member in a retracted condition.

15. A sequentially actuated, zero insertion force, edge board connector according to claim 11 wherein respective ones of said plurality of contact recesses and said plurality of contact passageways are aligned and arranged in rows along at least one side of said elongated aperture.

16. A sequentially actuated, zero insertion force, edge board connector according to claim 10 wherein:

said contact driving member has a channel shaped section including a base and a pair of integral upstanding sidewalls, the upper free edge of at least one sidewall having a profiled configuration adapted to sequentially engage said contacts as said contact driving member is driven by said cam.

17. A sequentially actuated, zero insertion force, edge board connector according to claim 16 wherein:

said profiled configuration of said sidewall comprises at least two steps.

18. A sequentially actuated, zero insertion force, edge board connector according to claim 16 wherein:

both sidewalls of said contact driving member are profiled.

19. A zero insertion force printed circuit board edge connector, comprising:

an insulating housing having a channel therein for receiving a printed circuit board along a board insertion path;

a row of electrical contacts positioned beside the channel, each contact having a contact surface for engaging the printed circuit board when such has been inserted into the channel;

a contact driving member; and a cam member movable to displace the contact driving member normally of the channel to move each contact between a board receiving first position in which the contact surface of the contact is withdrawn from the board insertion path and a board engaging second position in which such contact surface intersects the board insertion path, characterised in that the contact driving member is formed with relatively stepped surfaces succeeding one another in the longitudinal direction of the channel for sequential engagement with the contacts of the row, to move them sequentially between their first and second positions, in response to the movement of the cam member.

20. A connector according to claim 19, characterised in that each stepped surface is dimensioned to engage a group of the contacts simultaneously.

21. A connector according to claim 19, characterised in that the contact driving member is channel shaped, comprising a base from opposite edges of which extend side walls the stepped surfaces being formed in at least one of the side walls.

22. A connector according to claim 19, characterised in that the cam member has a handle which extends exteriorly of the housing and is insertable in a recess therein, to secure the cam member to the housing and to restrain movement of the cam member relative to the housing, when the contacts are in their second position.

* * * * *